(12) United States Patent
Adams et al.

(10) Patent No.: US 8,853,803 B2
(45) Date of Patent: Oct. 7, 2014

(54) MICRO-ELECTROMECHANICAL SYSTEM DEVICES

(75) Inventors: Scott G. Adams, Ithaca, NY (US);
Andrew J. Minnick, Ithaca, NY (US);
Charles W. Blackmer, Ithaca, NY (US);
Mollie K. Devoe, Ithaca, NY (US)

(73) Assignee: Kionix, Inc., Ithaca, NY (US)

( * ) Notice: Subject to any disclaimer, the term of this patent is extended or adjusted under 35 U.S.C. 154(b) by 273 days.

(21) Appl. No.: 13/571,844

(22) Filed: Aug. 10, 2012

(65) Prior Publication Data
US 2013/0026584 A1    Jan. 31, 2013

Related U.S. Application Data

(63) Continuation of application No. 13/027,209, filed on Feb. 14, 2011, now Pat. No. 8,319,254.

(51) Int. Cl.
| | |
|---|---|
| *H01L 29/84* | (2006.01) |
| *B81B 3/00* | (2006.01) |
| *G01P 15/08* | (2006.01) |
| *H01L 29/87* | (2006.01) |
| *H01H 59/00* | (2006.01) |
| *H01L 29/747* | (2006.01) |

(52) U.S. Cl.
CPC ........... *B81B 3/0008* (2013.01); *G01P 15/0802* (2013.01); *H01L 29/87* (2013.01); *H01H 59/0009* (2013.01); *H01L 29/747* (2013.01); *B81B 2201/0235* (2013.01); *B81B 2207/07* (2013.01)
USPC ................... 257/415; 257/108; 257/E29.324; 438/48; 438/50; 438/54

(58) Field of Classification Search
CPC ... H01L 29/87; H01L 29/747; H01L 27/0262; H01L 29/66992; G01P 15/0802; B81B 3/0008; B81B 2207/07; B81B 2201/0235
USPC ......... 257/108, 415, E29.324; 438/48, 50, 54
See application file for complete search history.

(56) References Cited

U.S. PATENT DOCUMENTS

| | | | |
|---|---|---|---|
| 5,563,343 | A | 10/1996 | Shaw et al. |
| 5,610,335 | A | 3/1997 | Shaw et al. |

(Continued)

OTHER PUBLICATIONS

Adams, S., et al., "A Single-Crystal Silicon Gyroscope with Decoupled Drive and Sense," Proc. SPIE 3876, 74 (1999), 10 pages.

(Continued)

*Primary Examiner* — Thinh T Nguyen
(74) *Attorney, Agent, or Firm* — Sterne, Kessler, Goldstein & Fox P.L.L.C.

(57) ABSTRACT

A micro-electromechanical system (MEMS) device can include a substrate and a first beam suspended relative to a substrate surface. The first beam can include a first portion and a second portion that are separated by an isolation joint made of an insulative material. The first and second portions can each include a first semiconductor and a first dielectric layer. The MEMS device can also include a second beam suspended relative to the substrate surface. The second beam can include a second semiconductor and a second dielectric layer to promote curvature of the second beam. The MEMS device can also include a third beam suspended relative to the substrate surface. The third beam consists essentially of a first material. The second beam is configured to move relative to the third beam in response to an acceleration along an axis perpendicular to the surface of the substrate.

18 Claims, 22 Drawing Sheets

(56) References Cited

U.S. PATENT DOCUMENTS

| | | | |
|---|---|---|---|
| 5,846,849 | A | 12/1998 | Shaw et al. |
| 6,009,757 | A | 1/2000 | LeComte et al. |
| 6,051,866 | A | 4/2000 | Shaw et al. |
| 6,239,473 | B1 | 5/2001 | Adams et al. |
| 6,318,174 | B1 | 11/2001 | Schmiesing et al. |
| 6,342,430 | B1 | 1/2002 | Adams et al. |
| 6,433,401 | B1 * | 8/2002 | Clark et al. .......... 257/524 |
| 6,484,578 | B2 | 11/2002 | Woodruff et al. |
| 6,626,039 | B1 | 9/2003 | Adams et al. |
| 6,701,786 | B2 | 3/2004 | Hulsing, II |
| 6,792,804 | B2 | 9/2004 | Adams et al. |
| 7,004,028 | B2 | 2/2006 | Park et al. |
| 7,430,909 | B2 | 10/2008 | Adams et al. |
| 7,858,422 | B1 | 12/2010 | Quevy et al. |
| 2005/0217374 | A1 | 10/2005 | Chen et al. |
| 2007/0119252 | A1 | 5/2007 | Adams et al. |
| 2008/0218933 | A1 | 9/2008 | Mi et al. |

OTHER PUBLICATIONS

Shaw, K.A., et al., "SCREAM I: A single mask, single-crystal silicon, reactive ion etching process for microelectromechanical structures," Sensors and Actuators A 40:63-70 (1994), 8 pages.

Zhang, Z.L., and MacDonald, N.C., "A RIE process for submicron, silicon electromechanical structures," J. Micromech. Microeng. 2:31-38 (1992), 8 pages.

International Search Report and Written Opinion for International Appl. No. PCT/US2012/024672, European Patent Office, The Netherlands, mailed on Aug. 23, 2012, 12 pages.

* cited by examiner

MICRO-ELECTROMECHANICAL SYSTEM DEVICES

CROSS-REFERENCE TO RELATED APPLICATION

This application is a continuation application of U.S. application Ser. No. 13/027,209, filed Feb. 14, 2011, which is incorporated by reference herein.

BACKGROUND OF THE INVENTION

1. Field of the Invention

The present invention is directed generally to micro-electromechanical system devices (MEMS devices), and more particularly to MEMS devices having an integral electrical isolation structure.

2. Background Art

MEMS devices are electrical and mechanical devices that are fabricated at substantially microscopic dimensions utilizing techniques well known in the manufacture of integrated circuits. Present commercial applications of MEMS devices are predominantly for pressure and inertial sensing, for example, accelerometers and gyroscopes used in hand-held devices, for example, cell phones and video game controllers.

For example, a MEMS device that is an accelerometer can detect when the cell phone experiences acceleration such as when the phone is rotated from a portrait orientation to a landscape orientation. Such a inertial sensing MEMS device can include a case or substrate, a mass resiliently held within the case, and a deflection sensor for measuring relative motion between the case and the mass. When an acceleration is experienced, the mass moves relative to the case, and the sensor measures the deflection. In most cases, the acceleration is directly proportional to the amplitude of the deflection. Processing steps have been developed to make a MEMS device having such a mass and deflection sensor. When a MEMS device is constructed using processes such as the one disclosed in U.S. Pat. No. 6,239,473 to Adams et al., silicon beams coated with silicon dioxide on three sides can be formed. These beams can have an isolation joint that moves with the rest of the structure. These isolation joints enable multiple electrical signals to be routed to multiple places within a device and applied to multiple electrical components such as sensors and actuators. However, MEMS devices fabricated according to the process outlined in U.S. Pat. No. 6,239,473 are susceptible to shock damage, interconnect damage, and frit seal failure.

Shock Damage

One cause of shock damage in an inertial sensing MEMS device relates to a dielectric coating on the sidewalls of the beams. If subjected to large accelerations, for example, when a cell phone or game controller strikes the ground after being dropped, the sidewalls of the beams can contact each other, causing the dielectric coating to wear by chipping or abrasion. During the wear process, chemical bonds between molecules in the dielectric sidewall coatings are broken, creating an electrical charge on the sidewall surface. Because these sidewall surfaces are often silicon dioxide, an insulating material, the electrical charges do not dissipate quickly. The charges can persist for hours or even days after the mechanical shock occurred. At the size scale of MEMS devices, these charges can affect the operation of the MEMS device.

An electrical charge on the outer surface of the dielectric sidewall coatings can causes a net force on the beam. This net force is indistinguishable from an acceleration that causes the beam to move. Therefore, a charged device produces a false acceleration signature.

Interconnect Damage

In addition to damage to the dielectric sidewall coatings, offset shifts can also be created by a permanent plastic deformation or bend in the metal used to electrically interconnect various portions of the MEMS device from the application of large forces during operation. Plastic deformation of the interconnect metal can causes the entire beam to deform, which can cause a perceived offset shift and a false acceleration signature.

The interconnect metal can also be deformed by large temperature excursions. MEMS devices fabricated using the process discussed in U.S. Pat. No. 6,239,473 comprise multiple materials, for example, silicon dioxide, silicon, and aluminum. Each of these materials has a different coefficient of thermal expansion, meaning that as the temperature changes, each material expands different amounts. Because the materials are joined together, the materials all deform approximately the same amount, causing a stress. If the stress levels are large enough, the materials can permanently deform. Aluminum deforms easier than either silicon or silicon dioxide. Accordingly, when a MEMS device is subjected to high temperatures excursions, for example, temperature excursions during the solder reflow cycles, the aluminum can plastically deform, causing a perceived offset shift and a false acceleration signature. The actual amount that a device deforms depends on the structural design and the quantity of metal used. For example, an accelerometer fabricated using the process discussed in U.S. Pat. No. 6,239,473 moves about 20 nm per g of acceleration. Due to the plastic deformation of the metal during reflow, the rest position of the accelerometer may shift up to 2 nm which is equivalent to a false reading of 100 mg's.

Minimizing the thickness of the interconnect metal can reduce the deleterious effects. However, in U.S. Pat. No. 6,239,473, the metal bond pads and the metal seal ring surface are formed from the same layer of metal comprising the interconnect metal, and the metal bond pads and the metal seal ring surface have minimum thickness requirements to function properly. Thus, a solution for reducing interconnect damage is not as simple as merely reducing the thickness of the metal layer forming the interconnect.

Seal Failures

MEMS devices such as those described in U.S. Pat. No. 6,239,473 use a lid to form a hermetic seal around the beams of the substrate. The lid can be coupled to the substrate using a frit seal that interfaces with a metal seal ring surface. If the interface between the frit seal and the metal seal ring surface is interrupted, for example, by a metal trace running directly under the metal seal ring surface to a bond pad, the interface between the lid and the substrate is weakened. The interface can also be weakened when the metal traces are covered locally with a passivation oxide to prevent any electrical interactions with the lid or fit seal. Accordingly, when a MEMS device having an interrupted interface between the lid's frit seal and the metal seal ring surface is subjected to excessive environmental stresses, the MEMS can fail caused by the weakened seal.

Accordingly, there is need for improved MEMS devices that can better withstand mechanical shocks, reduce the risk of metal interconnect damage, and provide improved frit seals.

BRIEF SUMMARY OF THE INVENTION

In an embodiment, a MEMS device can include a substrate and a first beam suspended relative to a surface of the substrate. The first beam can include a first portion and a second portion that are separated by an isolation joint. The isolation joint can be made of an insulative material. The first and second portions can each comprise a first semiconductor and a first dielectric layer. The MEMS device can also include a second beam suspended relative to the surface of the substrate. The second beam can include a second semiconductor and a second dielectric layer to promote curvature of the second beam. The MEMS device can further include a third beam suspended relative to the surface of the substrate. The third beam consists essentially of a first material. The second beam can be configured to move relative to the third beam in response to an acceleration along an axis perpendicular to the surface of the substrate.

In an embodiment, a computer-program product can include a computer-readable storage medium that contains instructions that, if executed on a computing device, define a MEMS device. The MEMS device can include a substrate and a first beam suspended relative to a surface of the substrate. The first beam can include a first portion and a second portion that are separated by an isolation joint. The isolation joint can be made of an insulative material. The first and second portions can each comprise a first semiconductor and a first dielectric layer. The MEMS device can also include a second beam suspended relative to the surface of the substrate. The second beam can include a second semiconductor and a second dielectric layer to promote curvature of the second beam. The MEMS device can further include a third beam suspended relative to the surface of the substrate. The third beam consists essentially of a first material. The second beam can be configured to move relative to the third beam in response to an acceleration along an axis perpendicular to the surface of the substrate.

In an embodiment, a hand-held device can include a MEMS device. The MEMS device can include a substrate and a first beam suspended relative to a surface of the substrate. The first beam can include a first portion and a second portion that are separated by an isolation joint. The isolation joint can be made of an insulative material. The first and second portions can each comprise a first semiconductor and a first dielectric layer. The MEMS device can also include a second beam suspended relative to the surface of the substrate. The second beam can include a second semiconductor and a second dielectric layer to promote curvature of the second beam. The MEMS device can further include a third beam suspended relative to the surface of the substrate. The third beam consists essentially of a first material. The second beam can be configured to move relative to the third beam in response to an acceleration along an axis perpendicular to the surface of the substrate.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1:
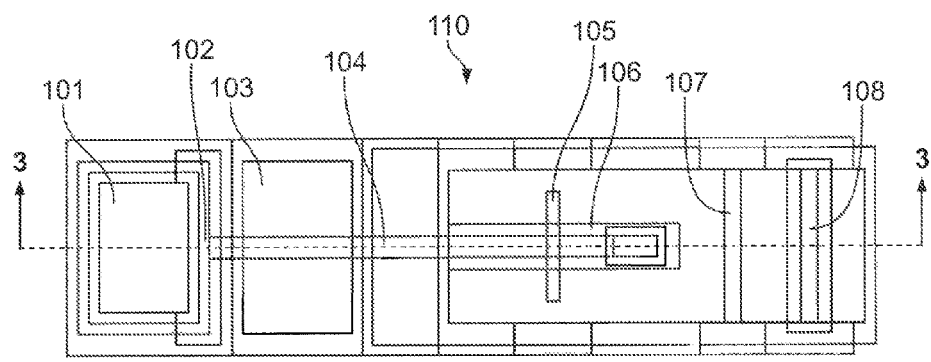
FIG. 1 is a top view of a MEMS device having an isolation joint that is fabricated according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION OF THE INVENTION

It is noted that references in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

As mentioned above, the present invention is directed to improved MEMS devices having isolation joints that can better withstand mechanical shocks, that reduce the risk of interconnect damage, and that provide a better fit seal. For example, MEMS devices according to embodiments of the present invention can better withstand mechanical shocks by removing dielectric material from portions of the MEMS device that contact each other during shock. Removing dielectric material from such contact portions prevents electrical charges that can create forces from forming. According to another embodiment, MEMS devices can reduce the risk of interconnect damage by forming a metal trace and a bond pad with different layers of metal, which allows the metal trace to have different properties than the bond pad. Additionally, other embodiments provide MEMS devices that have an improved frit seal because the metal trace does not disrupt the seal. Accordingly, MEMS devices having isolation joints that can better withstand mechanical shocks, reduces interconnect damage, and provides a better frit seal and methods of making such MEMS devices will be described.

FIG. 1 is a top view CAD drawing used to create of MEMS device 100 according to an embodiment. MEMS device 100 can include a metal bond pad 101 and a metal trace 104. The metal bond pad 101 can be connected to the metal trace at connection 102. MEMS device 100 can also include a metal seal ring surface 103 for coupling with a lid (not shown). Metal trace 104 can run underneath the metal seal ring surface 103. MEMS device 100 can have one or more beams, for example, beams 106, 107, and 108. Beams 106, 107, and 108 can be used in inertial sensing MEMS devices such as those described in U.S. Pat. No. 7,430,909 to Adams et al., the entirety of which is hereby incorporated by reference herein.

Figure 2:
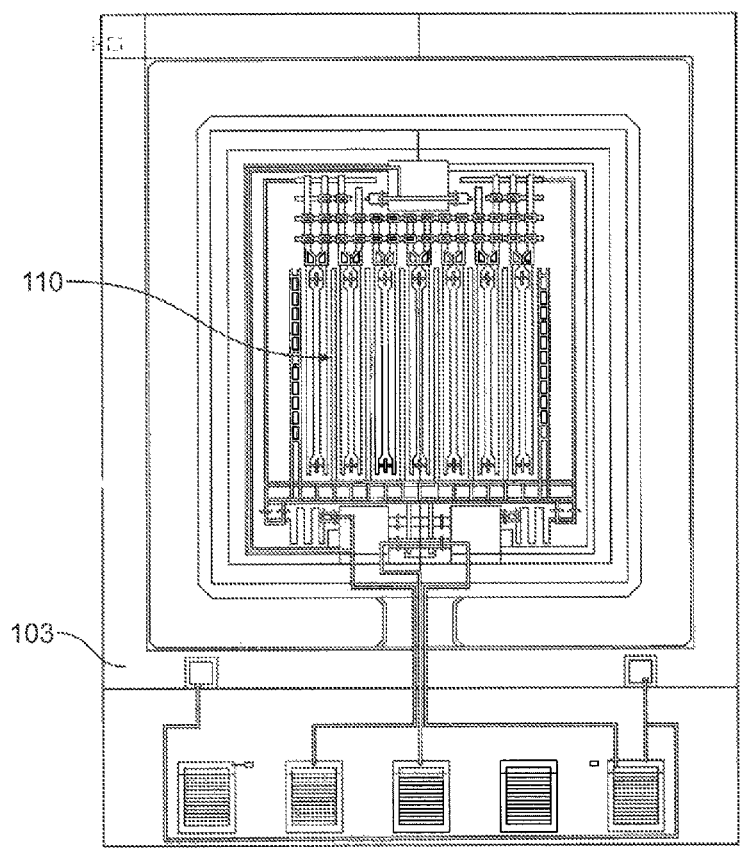
FIG. 2 is a top view of a MEMS device having an isolation joint that is fabricated according to an embodiment of the invention.

FIG. 2 is a top view of a MEMS device according to another embodiment. In this embodiment, metal seal ring surface 103 is continuous—metal seal ring surface 103 completely surrounds the entire beam structure 110, which can include one or more beams. Accordingly, a continuous, uninterrupted seal can be formed about beam structure 110.

The MEMS devices 100 illustrated in FIGS. 1-2 are embodiments presented herein for illustrative purposes only. The invention is not limited to the specific embodiments illustrated in FIGS. 1-2. For example, a MEMs device can have a beam structure comprising any number of beams and beam configurations, and multiple beams can have isolation joints.

Figure 3:
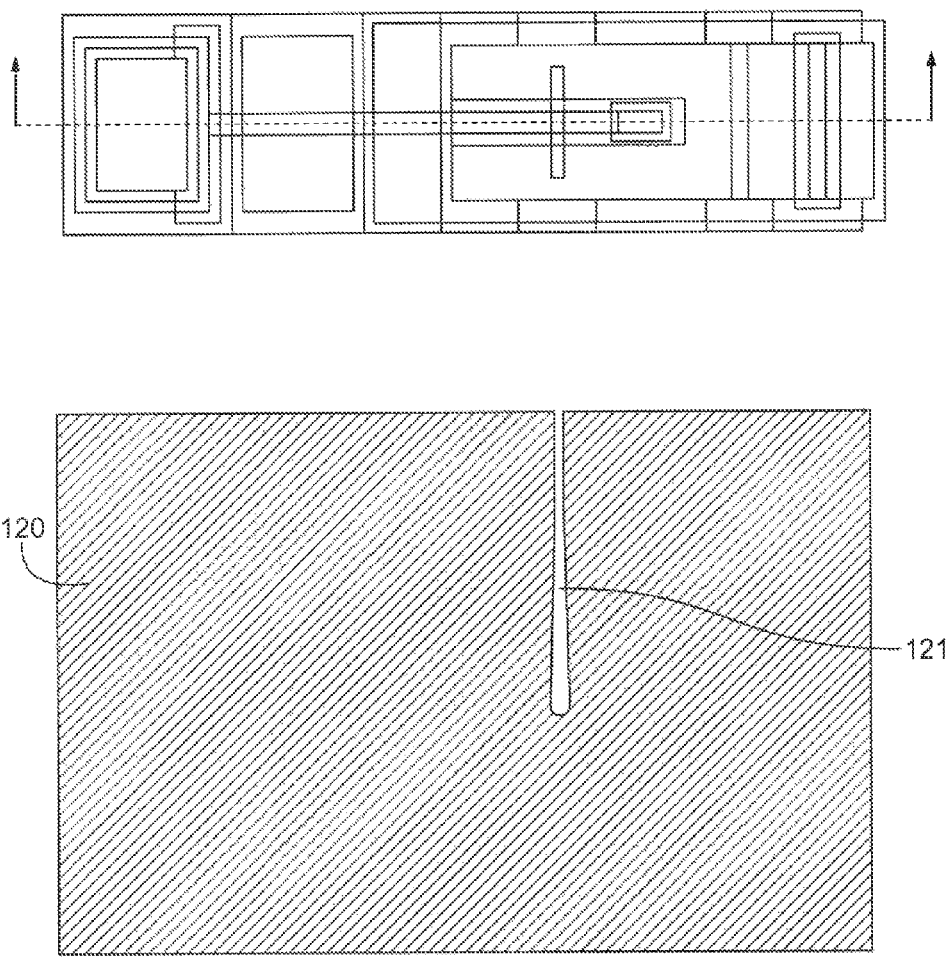
FIGS. 3-23 illustrate an exemplary method of making a MEMS device according to an embodiment of the invention.

FIGS. 3-23, which illustrate a cross section of MEMS device 100 along line 3-3, disclose embodiments of making MEMS device 100. In FIG. 3, an isolation trench 121 can be formed in a substrate 120. The substrate can be, for example, a silicon wafer that is boron doped to 5 mOhm-cm with a <100> stallographic orientation. Doping levels, resistivity, and crystallographic orientation, however, can vary. The substrate 120 can also have a dielectric layer, for example, silicon dioxide (not shown). For example, substrate 120 can be thermally oxidized to form a 500 nm oxide mask layer; however, any other suitable method can be used such as chemical vapor deposition (CVD).

In an embodiment, isolation trench 121 can be formed using any suitable lithographic technique, for example, photolithography, electron-beam lithography, imprint lithography, and any other suitable form of lithography. A resist (not shown) can be spun onto substrate 120, and an isolation trench pattern can be defined in the resist and the oxide mask layer (if present) using, for example, a plasma dry etch in $CHF_3$ and $O_2$. The isolation trench pattern can be transferred to substrate 120 to form isolation trench 121 where isolation joint 105 will be formed. In one embodiment, a silicon etch chamber running the Bosch process that alternates between etching (for example, $SF_6$ etching) and passivation (for example, using $C_4F_8$) can be used to form the isolation trench 121. After the substrate 120 is etched, the resist and oxide mask layer can be removed using any suitable technique. Isolation trench pattern 121 can have any suitable profile, for example, a reentrant profile in which the top is narrower than the bottom as illustrated in FIG. 3. An embodiment includes a profile that monotonically increases in width.

Figure 4:
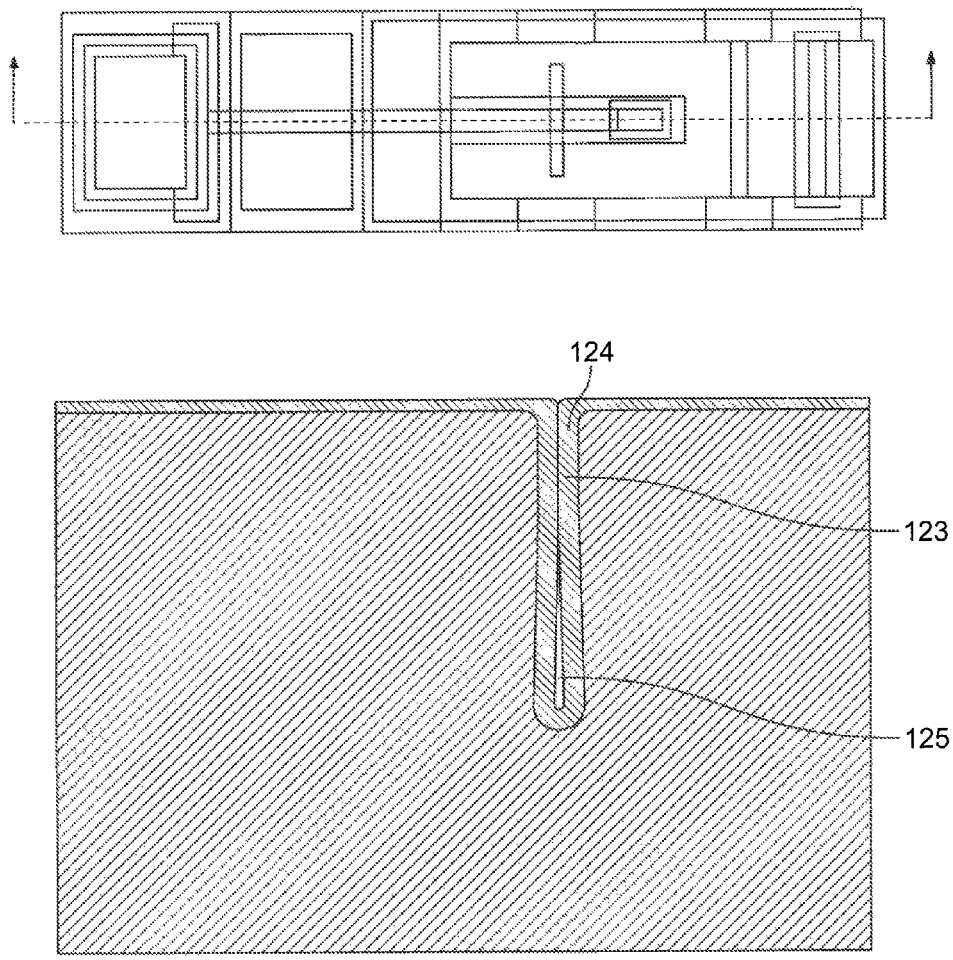

As illustrated in FIG. 4, isolation trench 121 can be filled with a dielectric material 123, for example, silicon dioxide or any other suitable dielectric material. In an embodiment, a silicon wafer can be thermally oxidized to form a layer of silicon dioxide. The silicon wafer can be oxidize at approximately 1100 C to 1200 C with wet oxidation to form silicon dioxide having a thickness of about 1.5 to 2.5 μm. An opening 124 of isolation trench 121 can be sealed, and a void 125 may remain after the oxidization process.

Optionally, any divots in the dielectric layer 123 at opening 124 can be planarized. For example, a resist-based planarization can be used to reduce or eliminate a divot at opening 124. During such a planarization step, dielectric layer 123 on top of the substrate 120 can be reduced to a thickness of about 0.5 μm to 1.5 μm. However, this thickness can vary based on the particular MEMS device being fabricated. Although a resist planarization is described, other suitable planarization techniques can be used, for example, chemical mechanical polishing.

Figure 5:
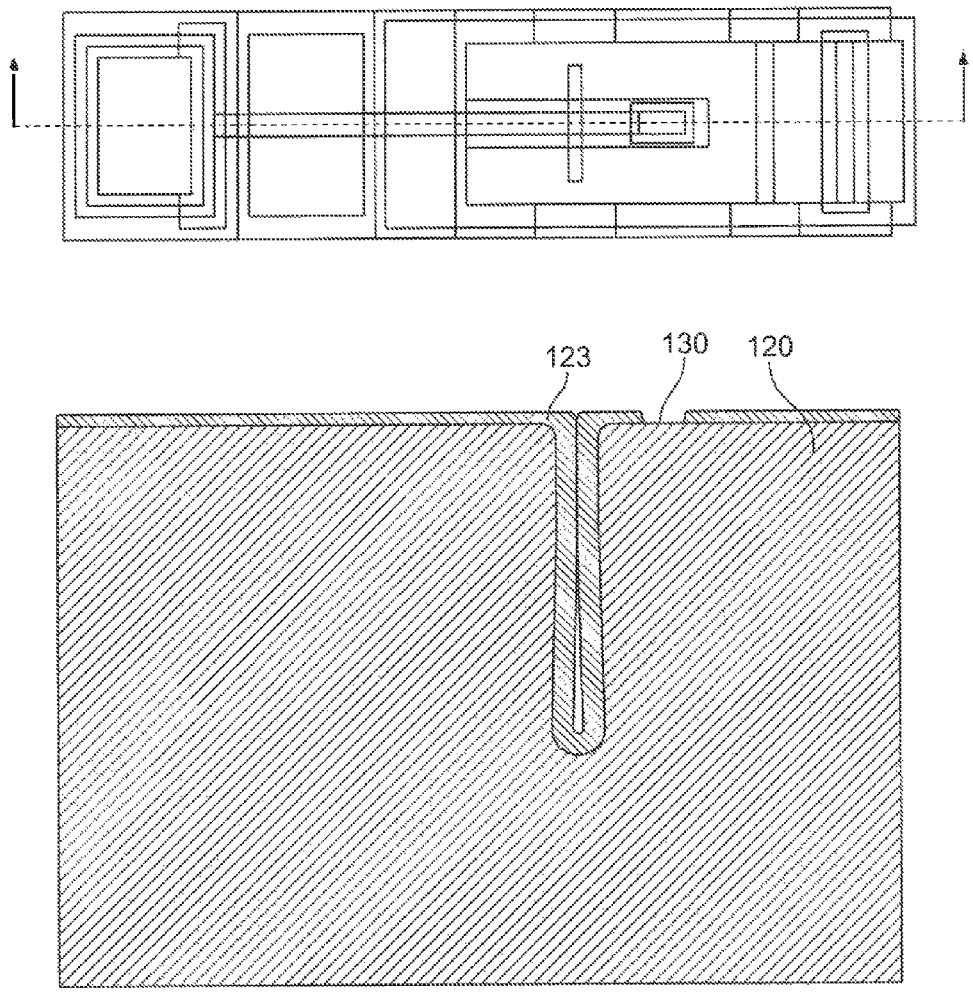

As illustrated in FIG. 5, an opening or via 130 can be formed in dielectric layer 123. Any suitable lithographic technique, for example, photolithography, and dry etching can be used to define via 130 in dielectric layer 123. Via 130 can be used to electrically couple the substrate 120 to a subsequent metal layer. Optionally, the surface of substrate 120 exposed at via 130 can by prepared for such an electrical coupling by forming a layer of oxide on the exposed surface, for example, by thermally and dry oxidizing substrate 120 at about 850 C to 950 C to form about 100 A of oxide. This oxide layer can then be dipped off in liquid HF prior to forming a metal layer over the top of the exposed surface of substrate 120.

Figure 6:
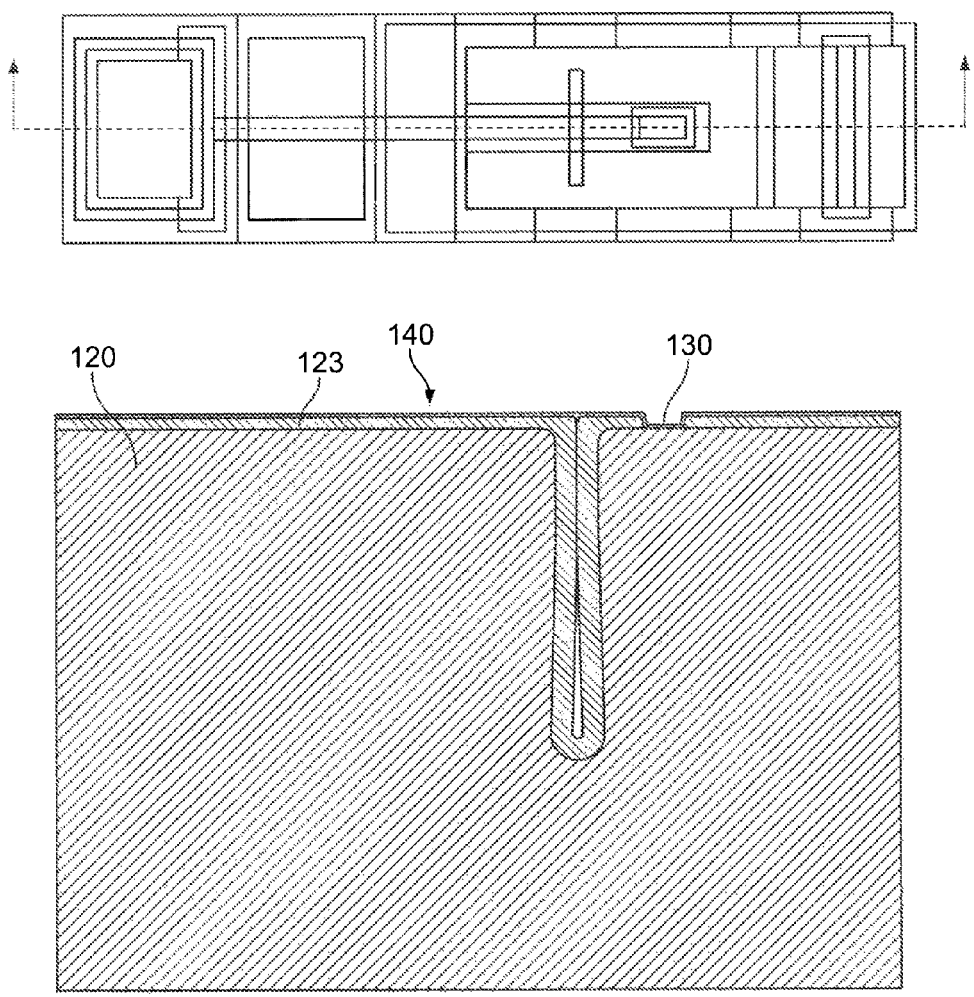

Subsequently, as illustrated in FIG. 6, a metal layer 140 can be formed. In an embodiment, metal layer 140 can have a thickness of about 2500 A to 3500 A. In other embodiments, the thickness of metal layer 140 can be formed as thin as possible without compromising the structural integrity. Metal layer 140 can be aluminum, titanium nitride, aluminum-silicon, aluminum-silicon-copper, or any other suitable metal or alloy.

Figure 7:
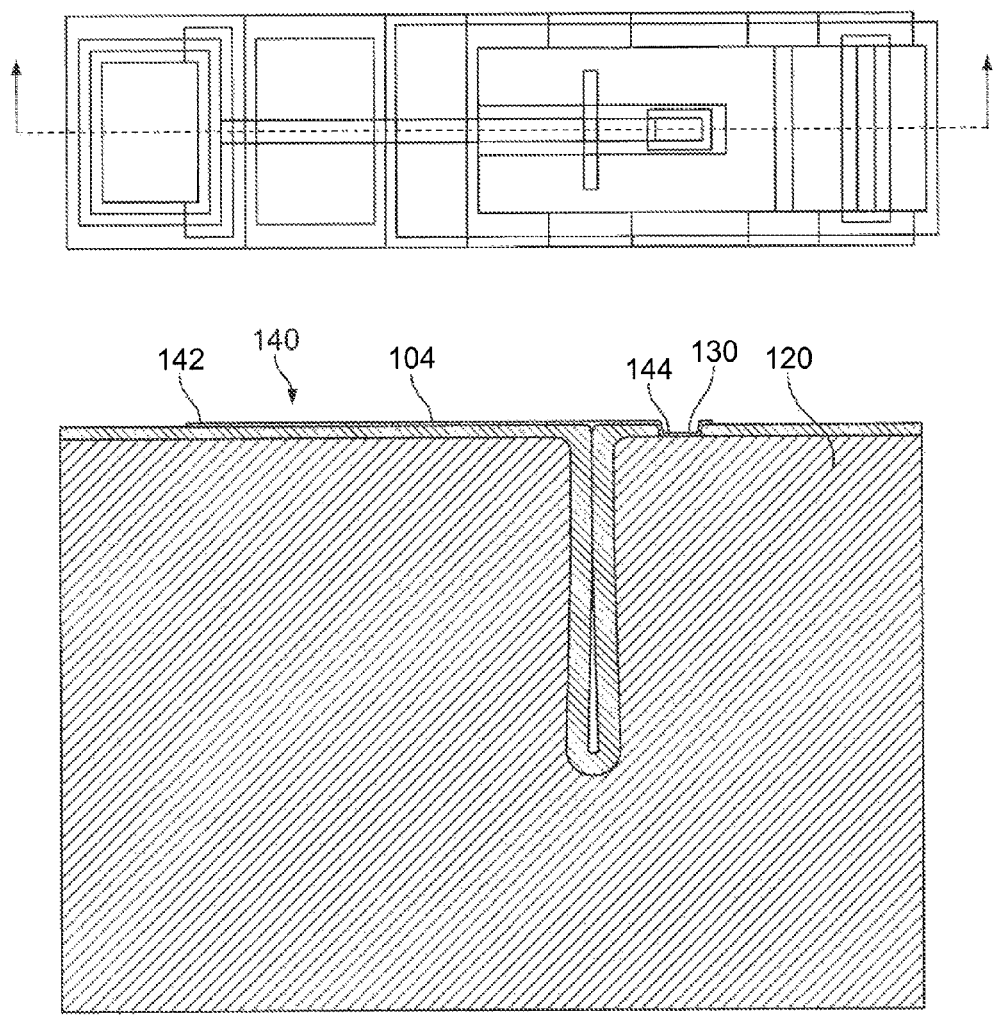
Figure 14:
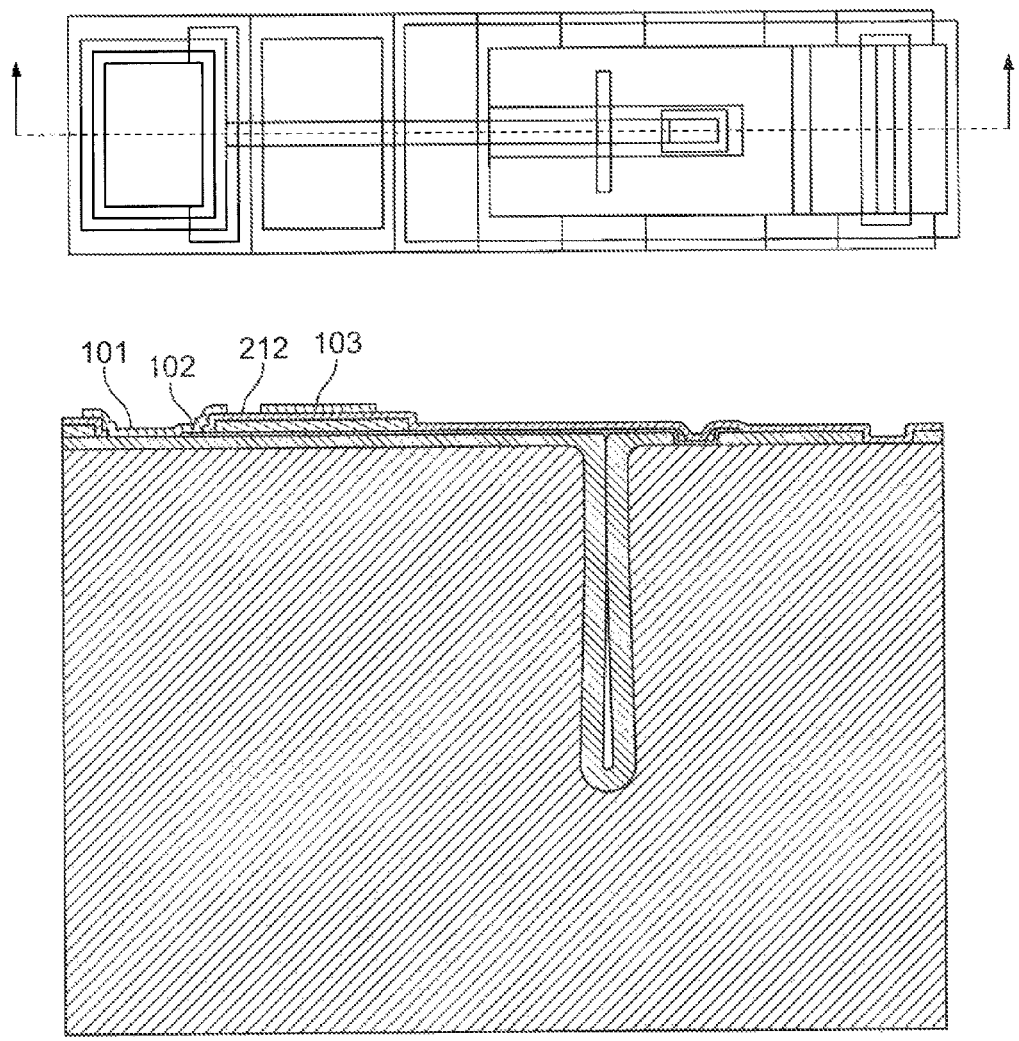
Figure 15:
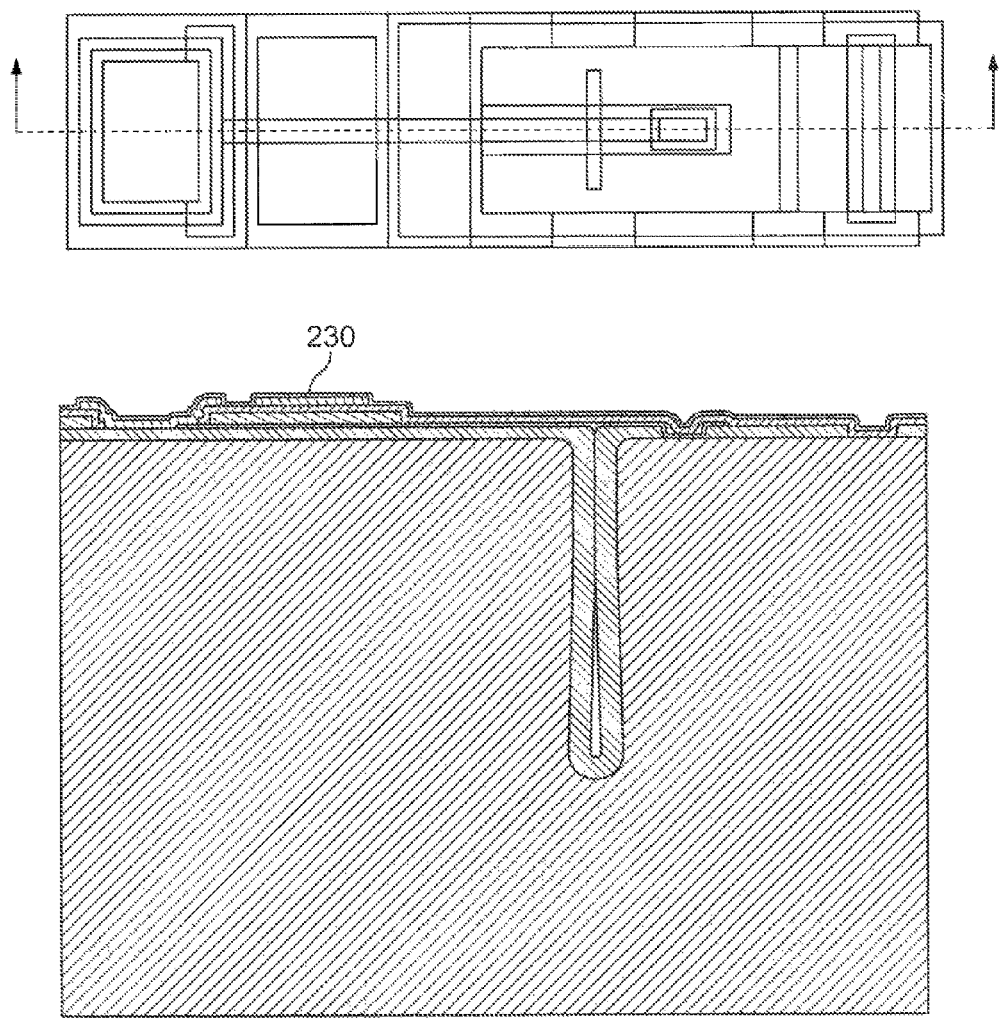

In an embodiment, metal layer 140 can be patterned to define the metal trace 104 that serves as an interconnect layer on the MEMS device that runs along beam 106 as illustrated in FIG. 7. Metal trace 104 can include a proximal end portion 142 and a distal end portion 144. Proximal end portion 142 can form connection 102 with the metal bond pad 101 as illustrated in FIG. 14 and described below. Distal end portion 144 can be electrically coupled to a distal portion of substrate 120 through via 130. Metal trace 104 can be formed using any suitable lithographic technique, for example, photolithography, and metal etching.

Figure 8:
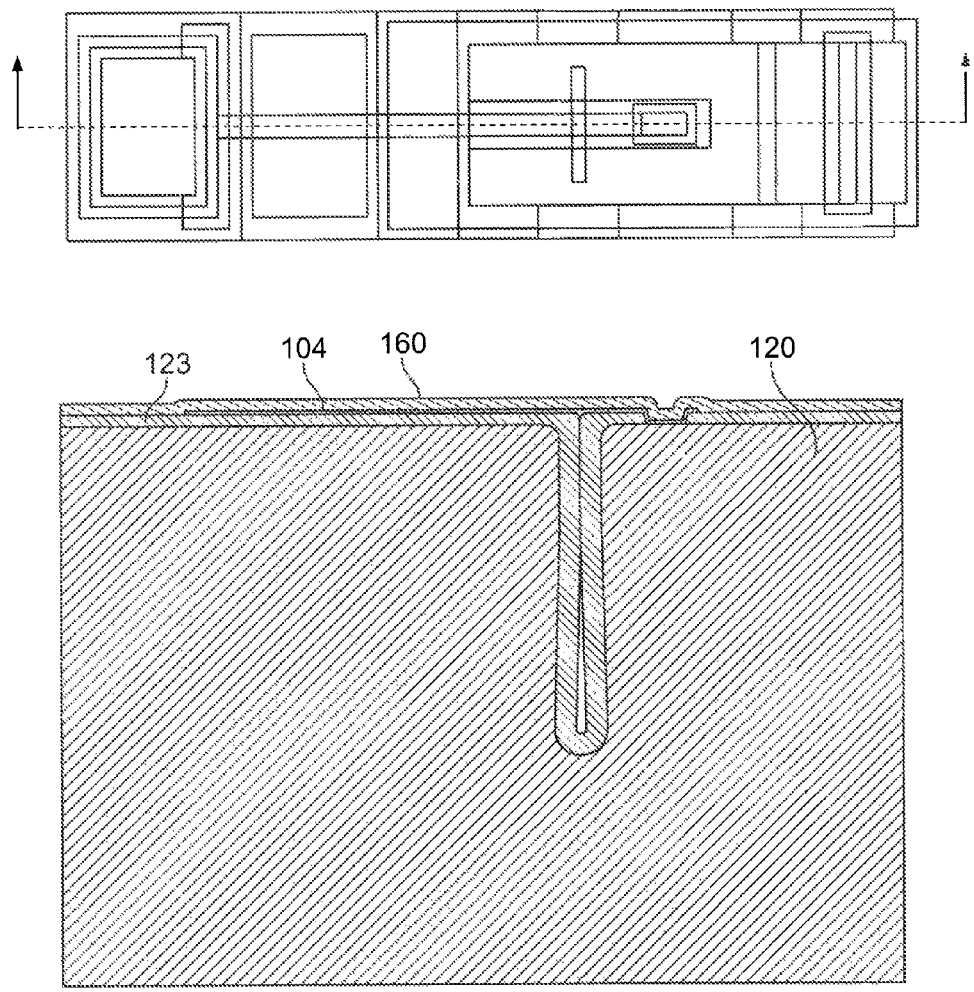

As shown in FIG. 8, a dielectric passivation layer 160 can be formed, covering metal trace 104 and dielectric layer 123 on substrate 120. Dielectric passivation layer 160 can protect metal trace 104 during subsequent etching steps. In an embodiment, passivation layer 160 can be a TEOS oxide that is deposited at a high power to promote a higher density film, which better resists etching. In one example, a TEOS oxide can be deposited using an AMAT P5000 deposition tool running at about 400 C with approximately 1100 W of RF power, at approximately 8.2 mTorr pressure, with flow rates of approximately 1000 mg/min of TEOS, approximately 1000 sccm of $O_2$, and approximately 1000 sccm of He. Passivation layer 160, however, can be any suitable dielectric material.

Figure 9:
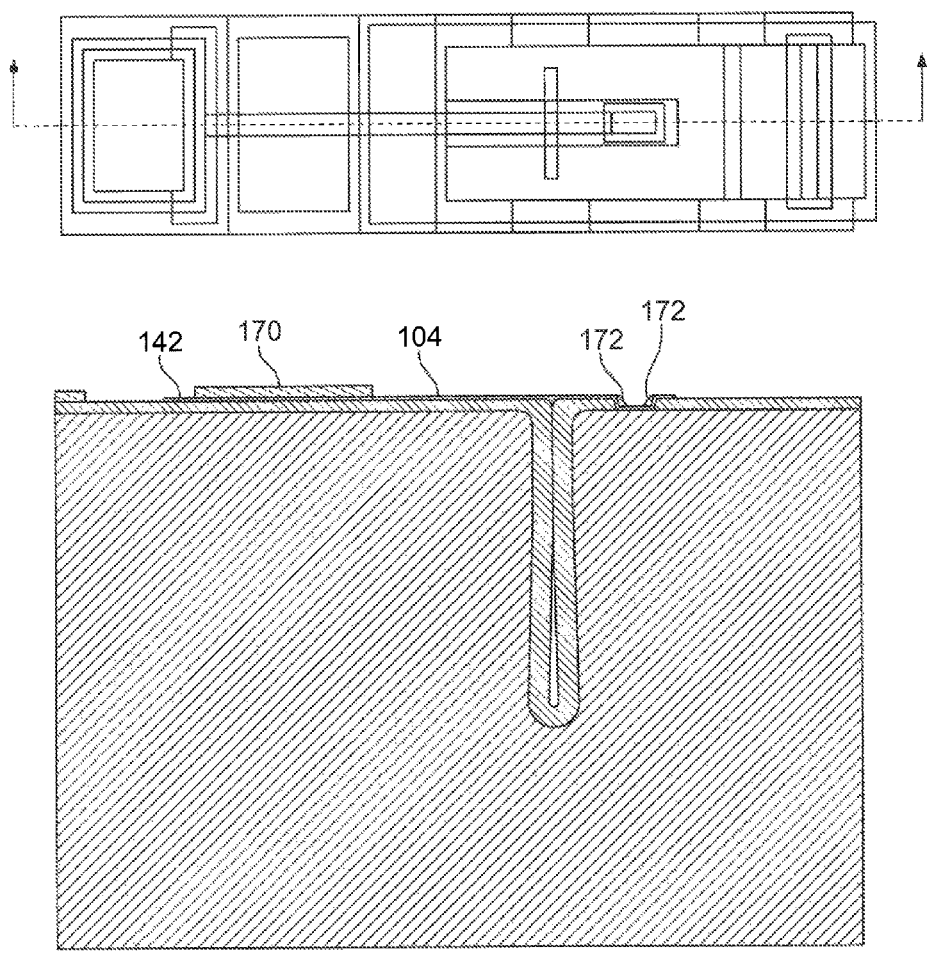

As shown in FIG. 9, portions of dielectric passivation layer 160 can be removed. For example, if passivation layer 160 is an oxide, passivation layer 160 can be patterned using any suitable lithographic technique, for example, photolithography, and etched with dry oxide etching. In an embodiment, patterned dielectric passivation layer 160 can include a base 170 for the metal seal ring surface 103 (see FIG. 14) and remnants 172 that persist adjacent to topography changes created by metal trace 104. In one example, dielectric passivation layer 160 is patterned and etched to expose distal end portion 142 of metal trace 104 from underneath dielectric passivation layer 160.

In an embodiment, any residue formed on substrate 120 from etching dielectric passivation layer 160 can be removed. For example, during a dry etch, residual polymers can form on vertical surfaces, and standard techniques for removing the resist used during the dry etch do not remove all of the residual polymers. Such polymers can produce unwanted features such as inhibition of subsequent etching, variability in etch rates, and irregular sheets of residual material that can peel off and obstruct beam movement. In one example, the residual polymers can be removed using REZI-78 residue removers. In one embodiment, the removal step can be followed with a spin-rinse-dry cycle.

Figure 10:
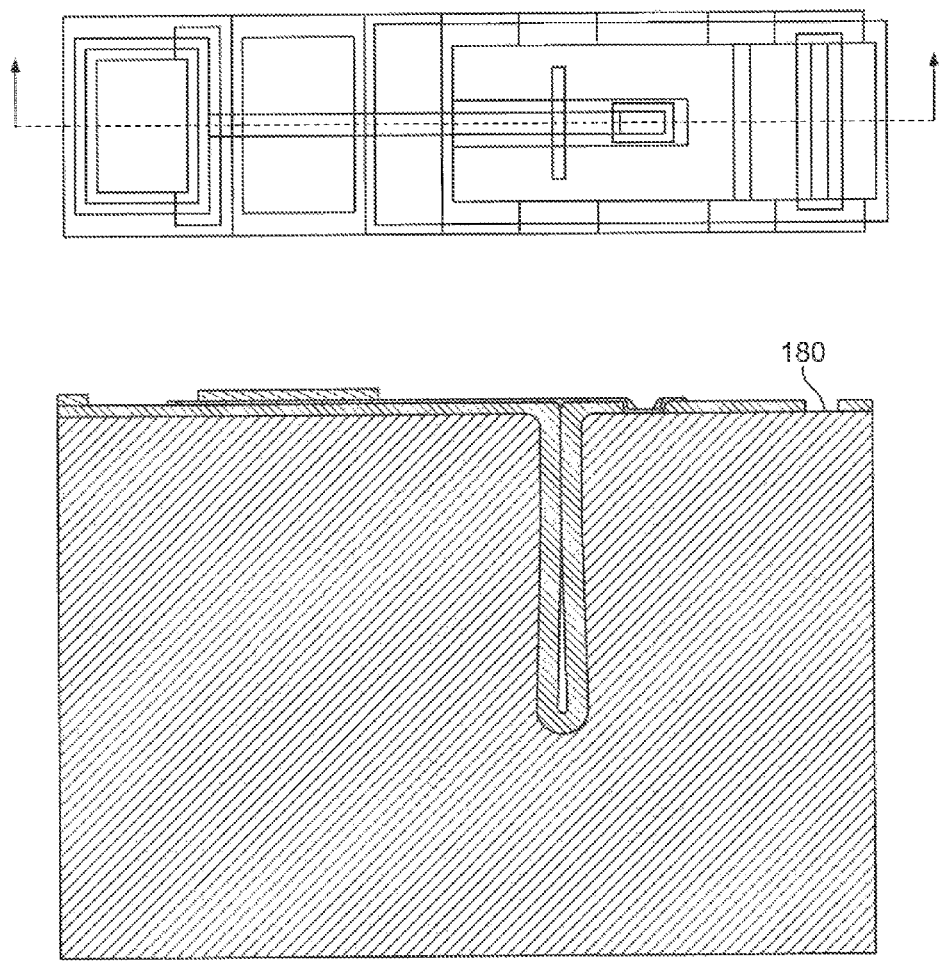

Next, as shown in FIG. 10, an opening 180 can be formed in dielectric layer 123 on the distal side of substrate 120. Opening 180 can be formed using any suitable lithographic technique, for example, photolithography, and dry oxide etching. In one embodiment, opening 180 corresponds to the top of a beam, for example, beam 108 (see FIG. 16). In an embodiment, any residue formed on the substrate 120 while etching dielectric material layer 123 can removed.

Figure 11:
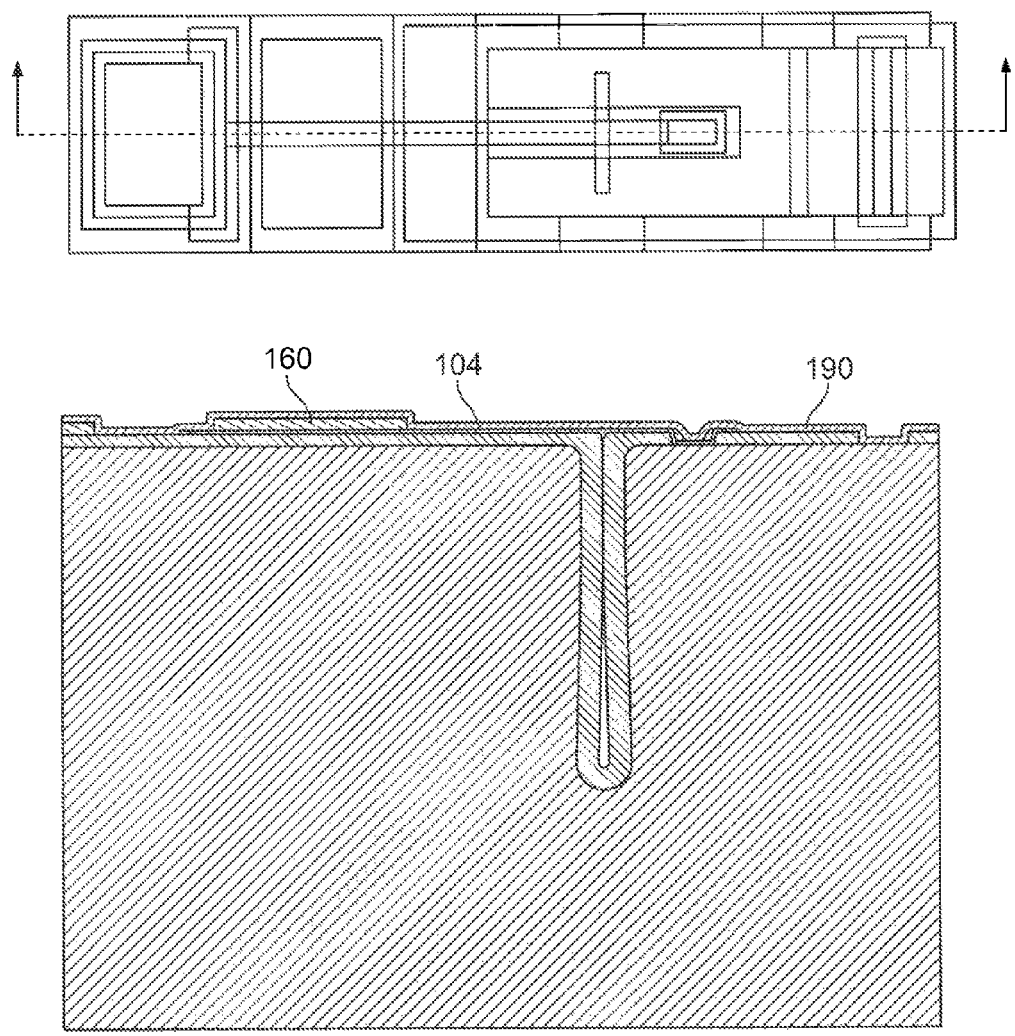

A second dielectric passivation layer 190 can be formed as shown in FIG. 11. For example, second dielectric passivation layer 190 can be a TEOS oxide having a thickness of about 4500 A to 5500 A. The TEOS oxide can be deposited at a lower power than at which passivation layer 160 was deposited, for example, 900W of RF power, so that passivation layer 190 is more susceptible to subsequent etching steps than passivation layer 160. Although second dielectric passivation layer 190 is described above as a TEOS oxide, passivation layer 190 can be other suitable dielectric materials. Passivation layer 190 can be an inter-metal dielectric layer that insulates metal trace 104 from subsequent layers of metal to be formed. Passivation layer 190 can also be used as a mask to pattern a beam such as beam 108 (see FIG. 16).

Figure 12:
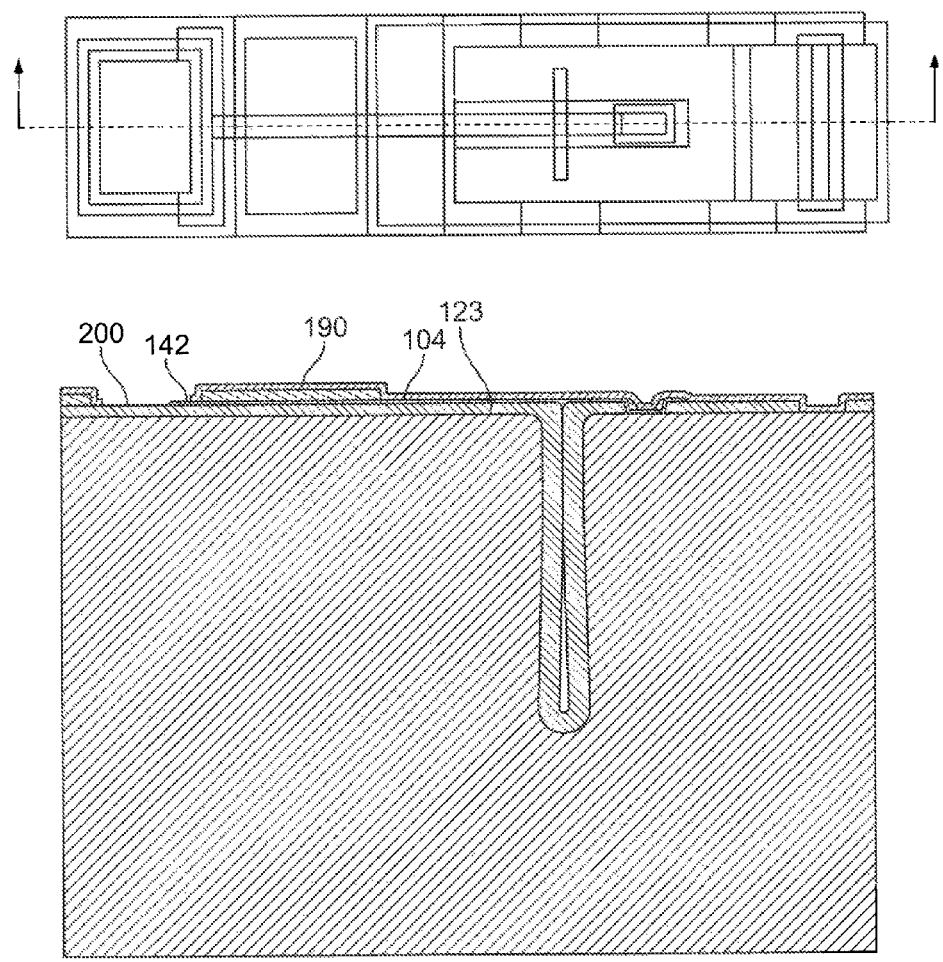

As shown in FIG. 12, passivation layer 190 can be patterned and etched. In an example, an opening or via 200 can be formed in the dielectric passivation layer 190, exposing a surface of dielectric layer 123 and proximal end portion 142 of metal trace 104. Any suitable lithographic technique, for example, photolithography, and etching can be used to form via 200. In one embodiment, any residue remaining from etching passivation layer 190 can be removed.

Figure 13:
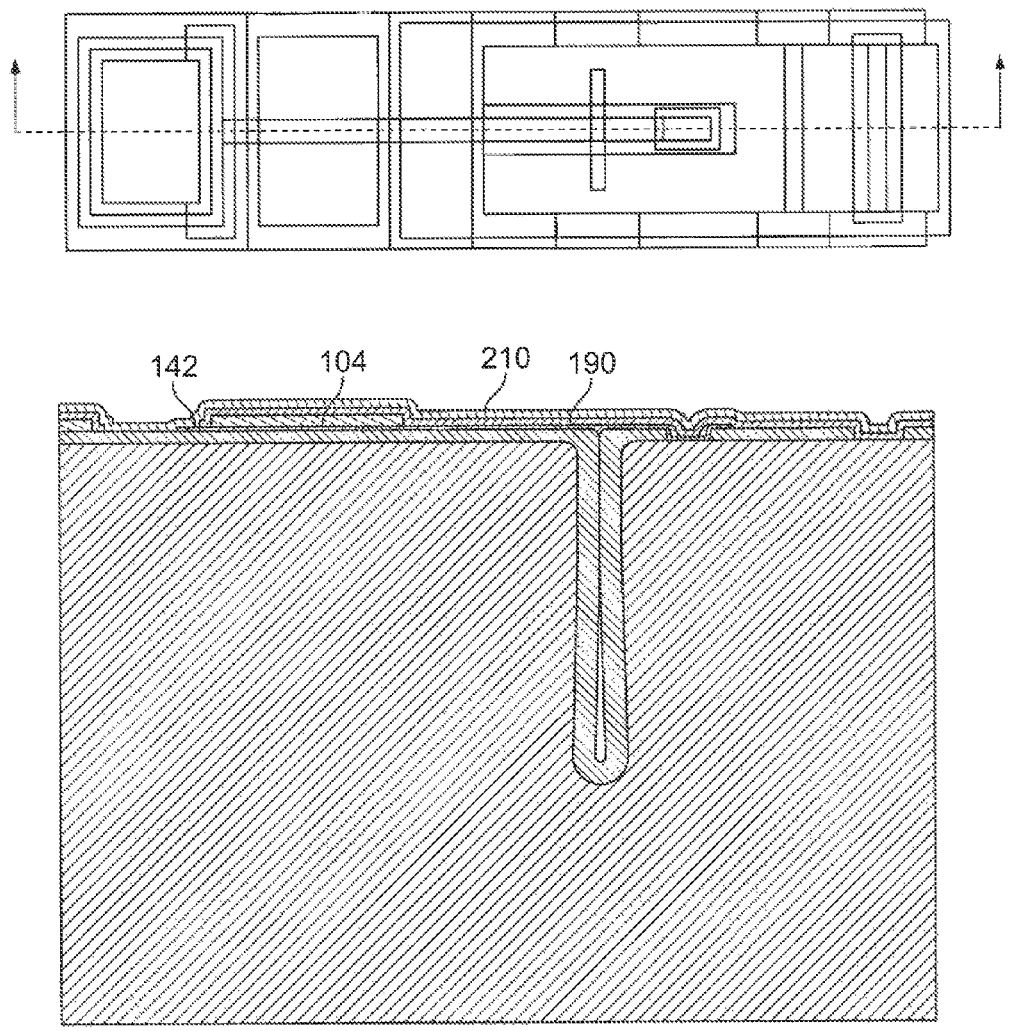

Next, a second metal layer 210 can be formed on the substrate 120 as shown in FIG. 13. Dielectric passivation layer 190 can be between second metal layer 210 and metal trace 104 except at exposed portion 142 of the metal trace 104. Second metal layer 210 can be aluminum, titanium nitride, aluminum-silicon, aluminum-silicon-copper, or any other suitable metal or alloy. For example, second metal layer 210 can be pure aluminum having a thickness of about 6500 A to 7500 A or any other suitable thickness to form metal bond pad and to form an interface for sealing with a glass fit.

As shown in FIGS. 12 and 13, second metal layer 210 can be patterned and etched. In one embodiment, a metal bond pad 101 and a metal seal ring surface 103 can be formed. In an embodiment, second metal layer 210 can be patterned such that the metal seal ring surface 103 surrounds the beam structure of MEMS device 100, creating a continuous seal when coupled to a lid (see FIGS. 22-23). In an example, second metal layer 210 can be patterned using any suitable lithographic technique and metal etching, for example, a wet or dry aluminum etching. In an embodiment, an opening or gap 212 can be formed. Gap 212 is between the metal seal ring surface 103 and connection 102 of metal trace 104 and bond pad 101. Gap 212 can allow a lid to be coupled to the metal seal ring surface 103 without metal trace 104 or metal bond pad 101 running immediately below the lid, which would disrupt the seal between the lid and the metal seal ring surface 103. This configuration can improve the seal strength.

In an embodiment, first metal layer 140 can form metal trace 104, and second material layer 210 can form metal bond pad 101 and metal seal ring surface 103. Using two layers of metal, allows metal trace 104 to have a different thickness than the bond pad 101 and metal seal ring surface 103. For example, in an embodiment, the thickness of first metal layer 140 is smaller than the thickness of the second metal layer 210. Accordingly, metal trace 104 that runs along a beam can be thin, which minimizes the influence of metal trace 104 on a beam despite the amount of plastic deformation that occurs from bending caused by an applied force or the fabrication process. Meanwhile, metal bond pad 101 and metal seal ring surface 103 can be thick, which promotes a durable frit seal with a lid at metal seal ring surface 103 and electrical connections at bond pad 101.

To protect metal bond pad 101 and metal seal ring surface 103 from subsequent etching, a dielectric passivation layer 230 can be formed on the substrate 120, covering at least metal bond pad 101 and metal seal ring surface 103 as shown in FIG. 14. In an embodiment, dielectric passivation layer 230 can be a TEOS oxide deposited to a thickness of approximately 1,500 A to 2,500 A. In one embodiment, the TEOS oxide can be deposited at low power, for example, approximately 900 W of RF power, to promote a later etching step.

Figure 16:
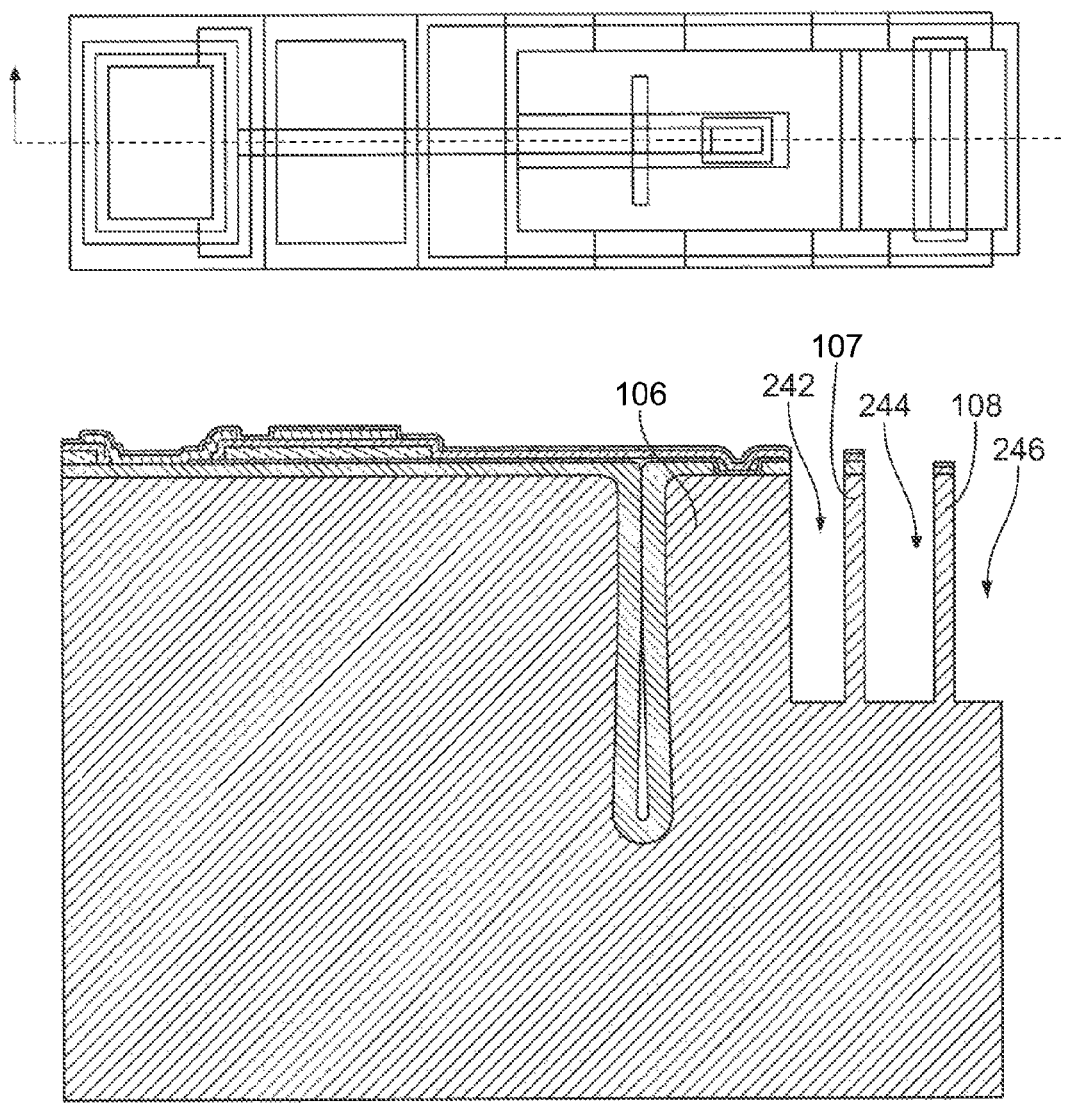

As shown in FIG. 16, substrate 120 can be patterned and etched to create at least one trench that can define a profile of a beam. For example, trenches 242, 244, and 246 can be formed in substrate 120 to define the profiles of beams 106, 107, and 108. In one embodiment, trenches 242, 244, and 246 can be formed by using any suitable lithographic technique, for example, photolithography, and a series of dry etching steps that etch dielectric passivation layer 230, dielectric passivation layer 190, dielectric layer 123, and substrate 120. In one example, a standard plasma dry etch using $CHF_3$ and $O_2$ can be used to etch dielectric passivation layer 230, dielectric passivation layer 190, and dielectric layer 123. In an embodiment, substrate 120 can be etched using a silicon etch chamber running the Bosch process. In another embodiment, metal trace 104 can be etched if it is within the masking stack. In yet another embodiment, any residue remaining from etching passivation layer 230, passivation layer 190, dielectric layer 123, and substrate 120 can be removed.

Figure 17:
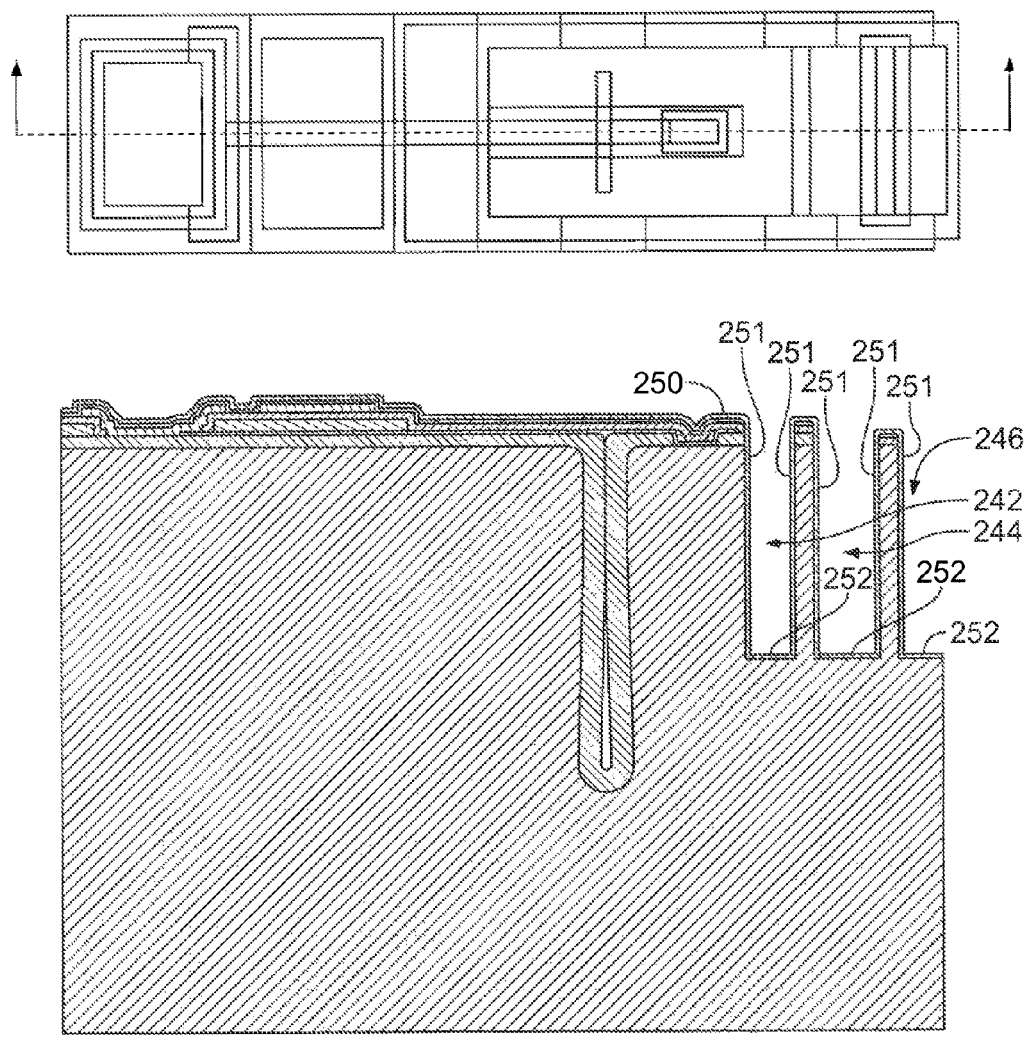

FIG. 17 shows an embodiment in which a fourth dielectric layer 250 can be formed on the substrate 120, covering at least the sidewalls 251 and floors 252 of the trenches 242, 244, and 246 formed in substrate 120. The fourth dielectric layer 250 can be an oxide. In one embodiment, the oxide is a TEOS oxide deposited at a low power, for example, approximately 1000 W of RF power.

Figure 18:
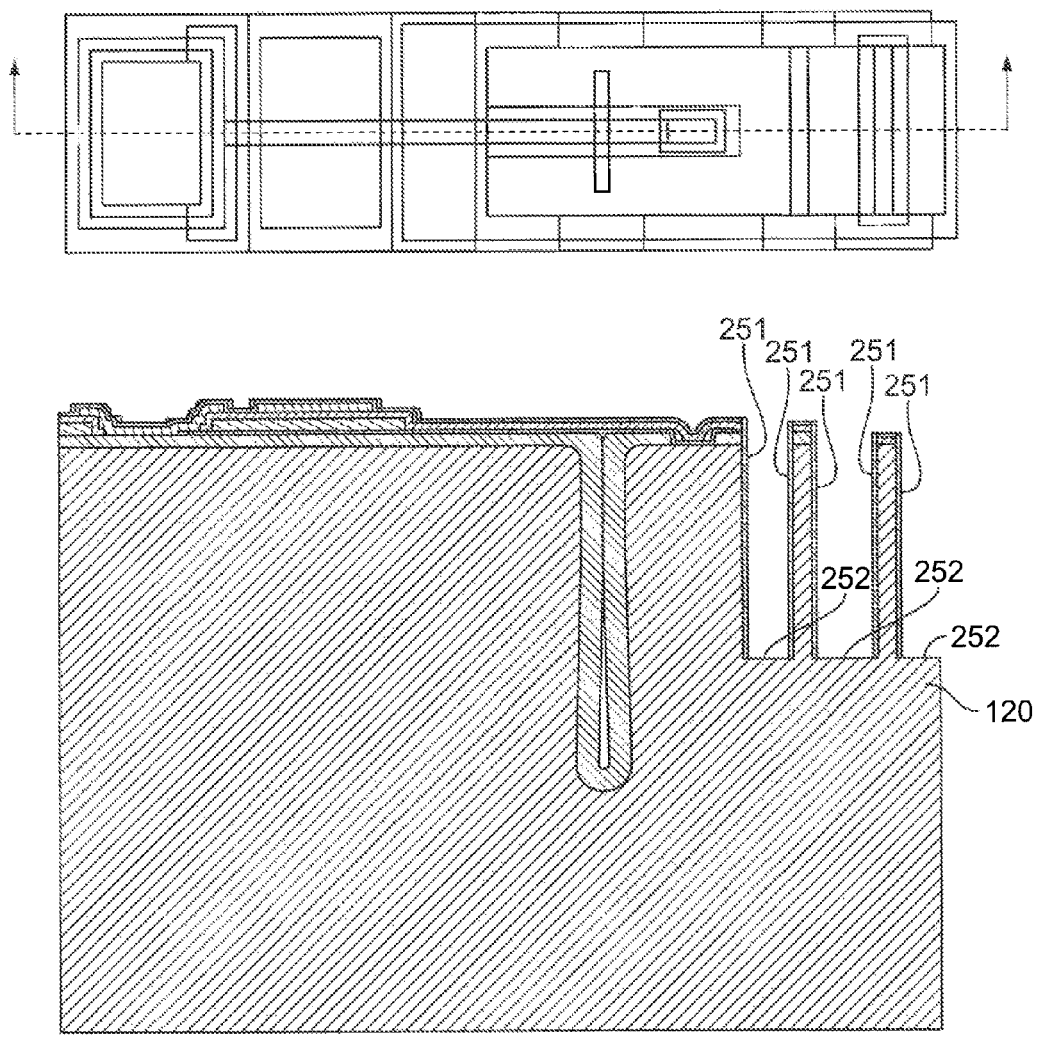

As shown in FIG. 18, portions of dielectric layer 250 that are formed on trench floors 252 can be removed. For example, an oxide layer 250 on trench floors 252 can be removed with an anisotropic dry oxide etch, exposing surfaces of substrate 120. In an embodiment, any residue formed on sidewalls 251 by the dry etch can be removed. By removing the residue on sidewalls 251, portions of dielectric layer 250 remaining on sidewalls 251 can be more easily removed in a subsequent etching step because such residues would inhibit a subsequent etch.

Figure 19:
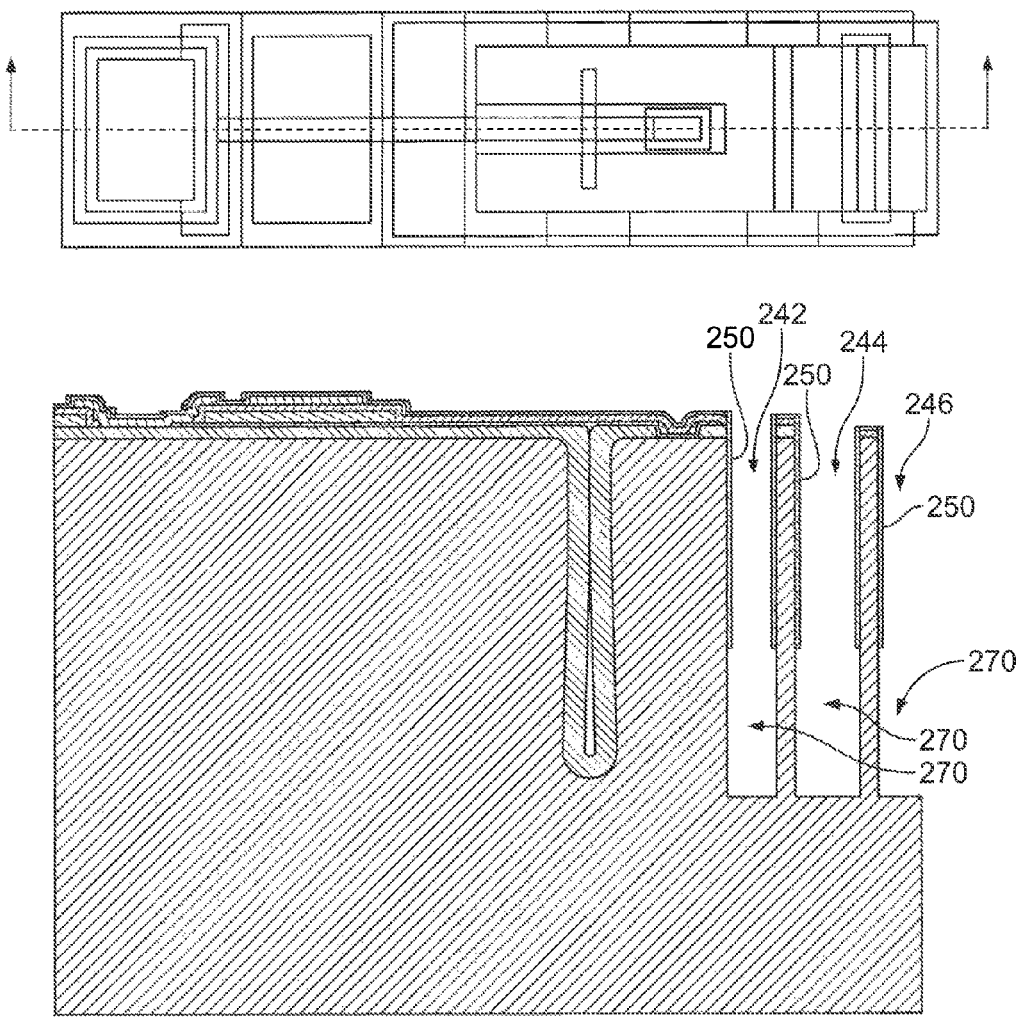

Next, as shown in FIG. 19, the depth of trenches 242, 244, and 246 can be extended by further etching substrate 120. In an example, a silicon substrate 120 can be etched using an anisotropic silicon extension etch. The resulting regions 270 of trenches 242, 244, and 246 can have sidewalls without dielectric layer 250. In one example, the depth of exposed regions 270 can be about 2 μm to 15 μm. The depth, however, can vary depending on the desired width of the beams 106, 107, and 108. The depth of exposed portions 270 can help define the distance between the resulting silicon beams 106, 107, and 108 and the floor of the substrate 120. In one embodiment, the residue formed from the silicon extension etch is not removed so that the wafer can be directly transitioned to a release etch, as described below, without venting the etch chamber, which can reduce the amount of native oxides that form on the substrate surface and can reduce any disruption to the initiation and reproducibility of the release etch. Alternatively, the residue can be removed.

Figure 20:
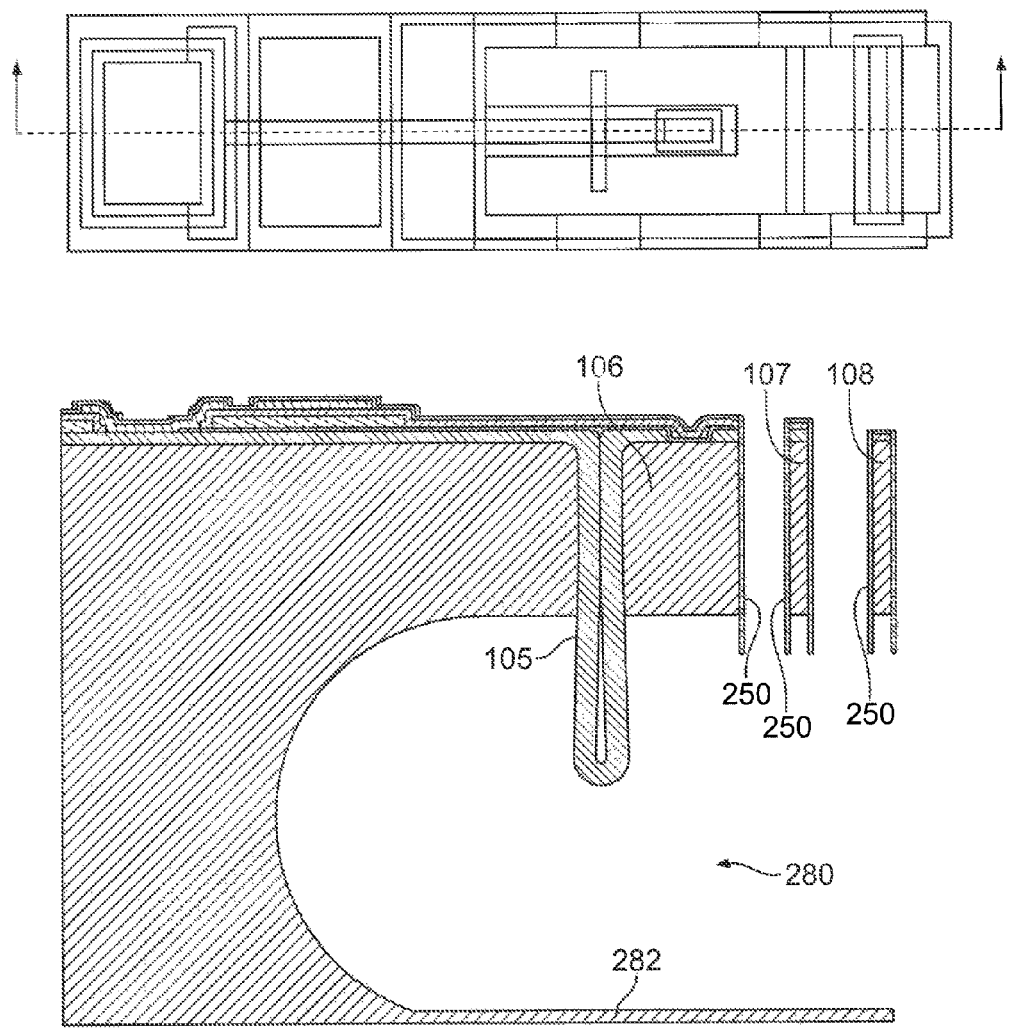

Next, at least one beam can be formed. For example, beams 106, 108, and 109 can be formed by a release etch. FIG. 20 shows an exemplary MEMS device after a release etch, for example, a dry isotropic silicon release etch such as a plasma etcher using $SF_6$. The release etch can create a cavity 280 that separates beams 106, 107, and 108 from a floor 282 of the substrate 120, thereby allowing beams 106, 107, and 108 to flex or move during operation of MEMS device 100. In an embodiment, after the release etch, beams 106 and 107 can have dielectric layer 123 and passivation layer 190 on top, while beam 108 can have only dielectric passivation layer 190 on top due to the opening 180 formed in oxide layer 123 during a prior processing step.

Figure 21:
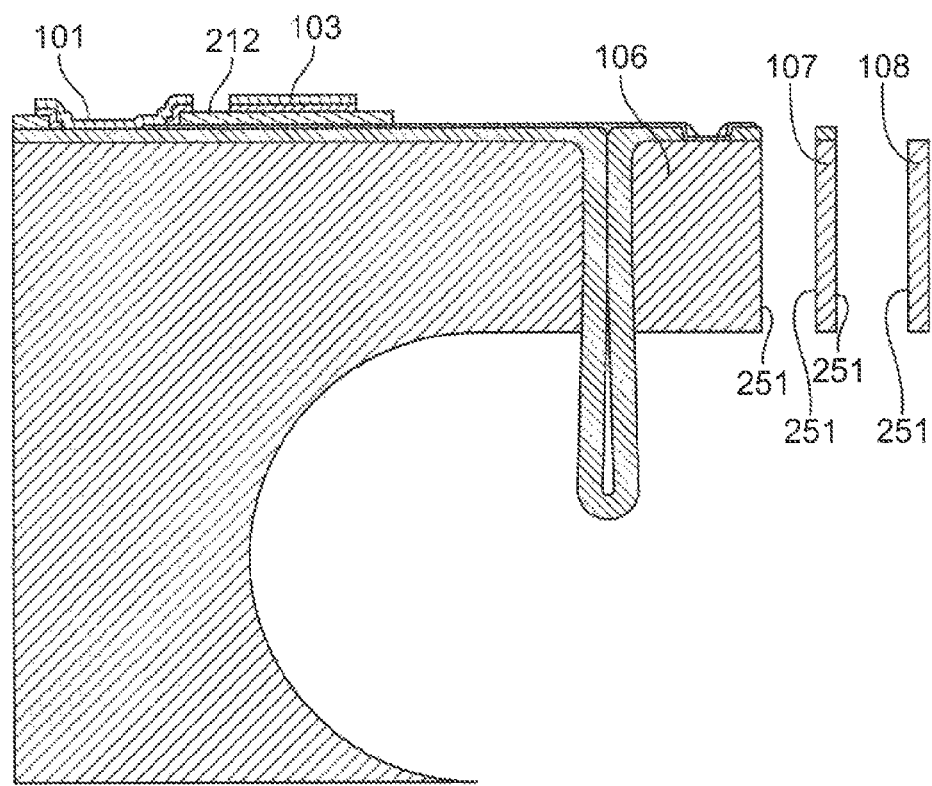

In one embodiment, portions of dielectric layer 250 that are formed on the sidewalls of beams 106, 107, and 108 can be removed as shown in FIG. 21. For example, these portions of dielectric layer 250 can be removed using a hydrogen fluoride (HF) vapor etching system such as a PRIMAXX system for approximately 4 minutes. Removing these portions of dielectric layer 250 on sidewalls 251 of beams 106, 107, and 108 can be advantageous. As discussed above, if there is a dielectric layer on sidewalls 251, electrical charges can develop in the sidewall coatings when the beams contact each other during operation of the MEMS device. By removing dielectric layer 250, the outer surface of sidewalls 251 comprises silicon, a semiconductor, and not a dielectric material. Accordingly, any electrical charges created from beam contact can dissipate quickly, which helps prevent a force from being applied to the beams. In an embodiment, the HF vapor etch is controlled so that etching of isolation joint 105 is reduced. If the HF vapor etch is uncontrolled, isolation joint 105 can be weakened since it can comprise silicon dioxide like dielectric layer 250. However, when isolation joint 105 is made from thermal oxide, isolation joint 105 etches at a slower rate than dielectric layer 250.

In another embodiment, dielectric layer 250 and passivation layer 190 can be removed from the top of the substrate during the HF vapor etch, exposing bond pad 101 and gap 212 around metal seal ring surface 103. This removal allows for wire bonding with the bond pad 101 and a lid to seal with the metal seal ring surface 230. In another embodiment, passivation layer 190 on top of beams 107 and 108 is removed during the HF vapor etch.

In one embodiment, the thickness of dielectric layer 250 and passivation layer 190 can be minimized to reduce the etching of the isolation joint 105 during the HF vapor etch. For example, the thickness of dielectric layer 250 and passivation layer 190 can be less than about 450 nm, and preferably less than about 400 nm. Any thickness below about 450 nm can minimize the etching effect on isolation joint 105. In another embodiment, an antistiction coating can be applied to help prevent beams 106, 107, and 108 from sticking during operation of the MEMS device.

Figure 22:
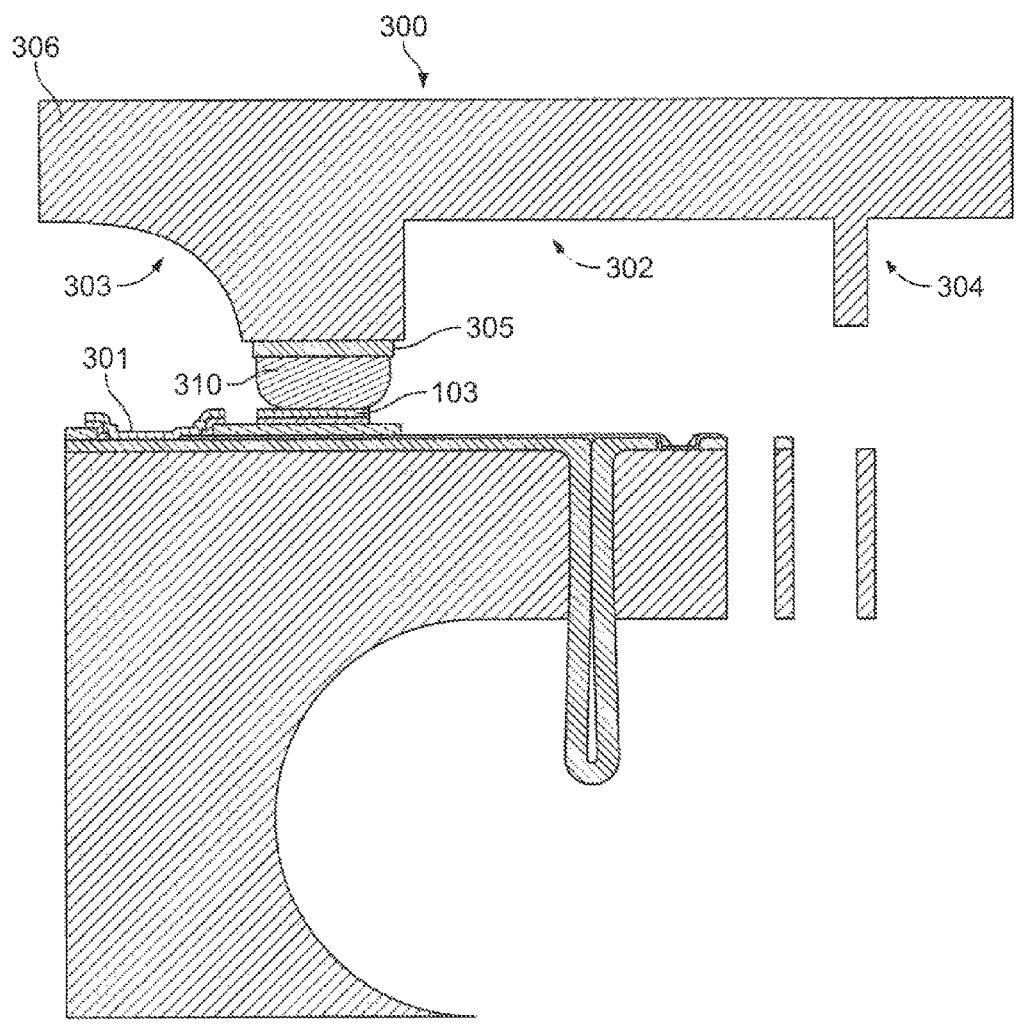

As shown in FIG. 22, a lid 300 can be coupled to the device at metal seal ring surface 103. Lid 300 can form a hermetic seal with the substrate 120. Lid 300 can include a metal seal region 305. In an embodiment, metal, seal region 305 can be, for example, aluminum deposited at 7,000 A. The metal seal region 305 can be patterned and etched using any suitable lithographic technique, for example, photolithography, and metal etching. Lid 300 can also have a bump stop 304 that prevents over flexing of one or more beams, for example, beam 108. Bump stop 304 can be formed by using any suitable lithographic technique, for example, photolithography, and silicon etching, for example, an anisotropic dry silicon etching, to define a recess 302. Lid 300 can also have a recess 303 along an outer edge defining a channel 306. Recess 303 can be formed using a wafer dicing saw to facilitate the removal of the channel silicon. A glass frit 310 can be formed on lid 300 by, for example, using a screen printer and a furnace heated up to about 420 C.

Figure 23:
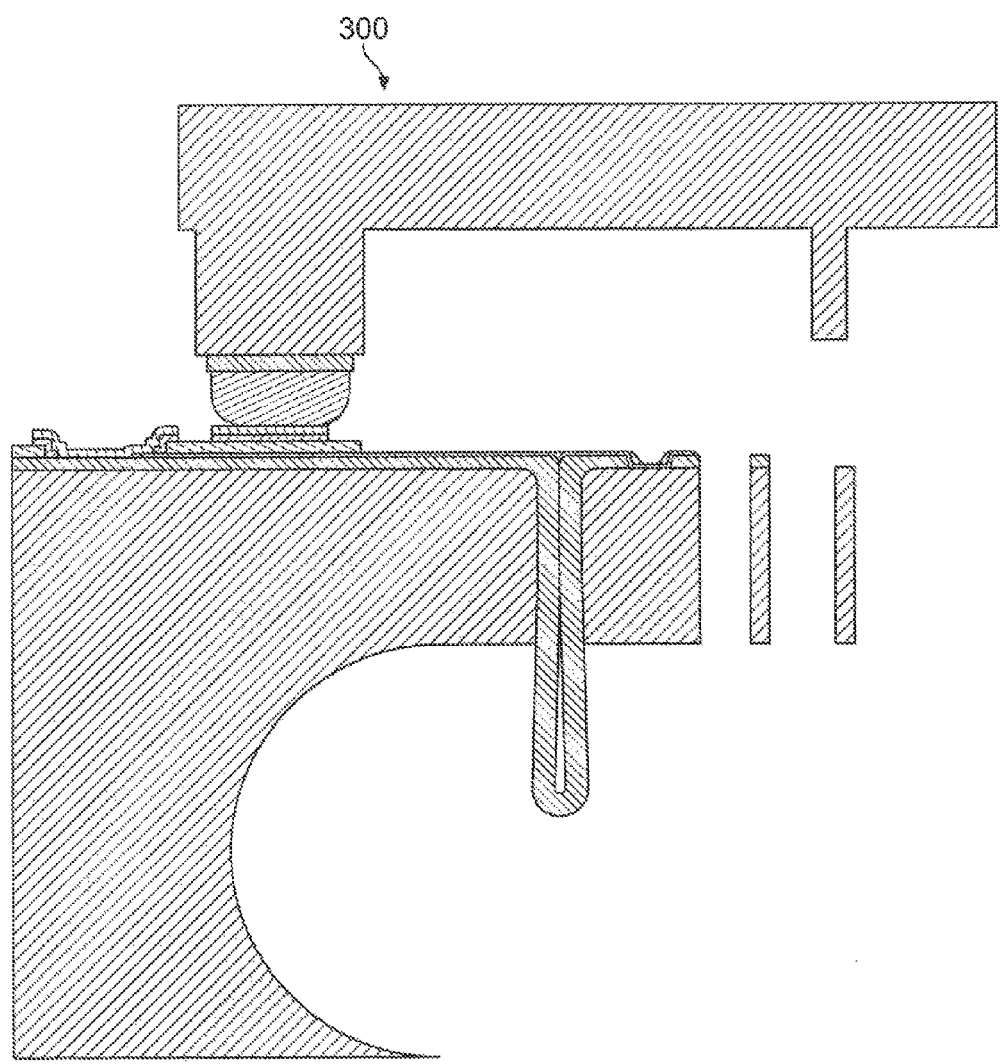

Lid 300 can be bonded with the substrate 120 by, for example, using a standard wafer bonder such as an EVG 501 bonder. After bonding, channel 306 can be removed to expose bond pad 101. Channel 306 can be removed by any suitable means, for example, a wafer dicing saw. The wafer dicing saw can be aligned using a preexisting pattern on the top of lid 300, or using an IR dicing saw that can see alignment marks through the lid on the lower side of the wafer. FIG. 23 shows lid 300 with channel 306 removed.

In another embodiment, a MEMS device can have a beam with an integrated isolation joint and a metal trace, for example, beam 106; a beam having an dielectric coating on top, for example, beam 107; a beam comprising only silicon, for example, beam 108; or any combination thereof. Beams having an isolation joint and a metal trace are useful in complex MEMS devices requiring multiple electrical potentials such as gyroscopes as in U.S. Pat. No. 6,626,039. Beams having a dielectric coating on top are useful for devices needing bowed beams, such as those described in U.S. Pat. No. 7,430,909, for enabling out-of-plane capacitive sensors. Beams comprising only silicon are useful for inertial sensors having surfaces that will impact and potentially charge if made or coated with a dielectric material.

EXAMPLES SOFTWARE IMPLEMENTATIONS

In addition to hardware implementations of MEMS devices described above, such MEMS devices may also be embodied in software disposed, for example, in a computer usable (e.g., readable) medium configured to store the software (e.g., a computer readable program code). The program code causes the enablement of embodiments of the present invention, including the fabrication of MEMS devices disclosed herein.

For example, this can be accomplished through the use of general programming languages (such as C or C++), hardware description languages (HDL) including Verilog HDL, VHDL, Altera HDL (AHDL) and so on, or other available programming and/or schematic capture tools (such as circuit capture tools). The program code can be disposed in any known computer usable medium including semiconductor, magnetic disk, optical disk (such as CD-ROM, DVD-ROM) and as a computer data signal embodied in a computer usable (e.g., readable) transmission medium (such as a carrier wave or any other medium including digital, optical, or analog-based medium). As such, the code can be transmitted over communication networks including the Internet and intranets. It is understood that the functions accomplished and/or structure provided by the systems and techniques described above can be embodied in program code and may be transformed to hardware as part of the production of MEMS devices.

What is claimed:

1. A micro-electromechanical system (MEMS) device, comprising:
a substrate;
a first beam suspended relative to a surface of the substrate, the first beam comprising a first portion and a second portion that are separated by an isolation joint, the isolation joint comprising an insulative material, wherein the first and second portions each comprise a first semiconductor and a first dielectric layer;
a second beam suspended relative to the surface of the substrate, the second beam comprising a second semiconductor and a second dielectric layer to promote curvature of the second beam; and a third beam suspended relative to the surface of the substrate, the third beam consisting essentially of a first material;

wherein the second beam is configured to move relative to the third beam in response to an acceleration along an axis perpendicular to the surface of the substrate.

2. The MEMS device of claim 1, wherein the first material comprises a third semiconductor.

3. The MEMS device of claim 2, wherein the first, second, and third semiconductors are silicon.

4. The MEMS device of claim 1, wherein each of the first, second, and third beams has a profile defining a side wall, and wherein the side wall of each of the first, second, and third beams has substantially no dielectric layer disposed thereon.

5. The MEMS device of claim 1, further comprising an electrically conductive trace that is mechanically coupled to the first beam and electrically coupled to the first semiconductor of the second portion but not the first semiconductor of the first portion.

6. The MEMS device of claim 5, wherein the electrically conductive trace comprises a metal.

7. The MEMS device of claim 1, wherein the movement of the second beam relative to the third beam is used in a capacitance-based displacement transducer.

8. A computer-program product comprising a computer-readable storage medium containing instructions that, if executed on a computing device, define a micro-electromechanical device comprising:

a substrate;

a first beam suspended relative to a surface of the substrate, the first beam comprising a first portion and a second portion that are separated by an isolation joint, the isolation joint comprising an insulative material, wherein the first and second portions each comprise a first semiconductor and a first dielectric layer;

a second beam suspended relative to the surface of the substrate, the second beam comprising a second semiconductor and a second dielectric layer to promote curvature of the second beam; and a third beam suspended relative to the surface of the substrate, the third beam consisting essentially of a first material;

wherein the second beam is configured to move relative to the third beam in response to an acceleration along an axis perpendicular to the surface of the substrate.

9. The computer-program product of claim 8, wherein the first material comprises a third semiconductor.

10. The computer-program product of claim 9, wherein the first, second, and third semiconductors are silicon.

11. The computer-program product of claim 8, wherein each of the first, second, and third beams has a profile defining a side wall, and wherein the side wall of each of the first, second, and third beams has substantially no dielectric layer disposed thereon.

12. The computer-program product of claim 8, wherein the micro-electromechanical device further comprises an electrically conductive trace that is mechanically coupled to the first beam and electrically coupled to the first semiconductor of the second portion but not the first semiconductor of the first portion.

13. The computer-program product of claim 12, wherein the electrically conductive trace comprises a metal.

14. The computer-program product of claim 8, wherein the movement of the second beam relative to the third beam is used in a capacitance-based displacement transducer.

15. A hand-held device comprising:

a micro-electromechanical system (MEMS) device comprising:

a substrate;

a first beam suspended relative to a surface of the substrate, the first beam comprising a first portion and a second portion that are separated by an isolation joint, the isolation joint comprising an insulative material, wherein the first and second portions each comprise a first semiconductor and a first dielectric layer;

a second beam suspended relative to the surface of the substrate, the second beam comprising a second semiconductor and a second dielectric layer to promote curvature of the second beam; and a third beam suspended relative to the surface of the substrate, the third beam consisting essentially of a first material;

wherein the second beam is configured to move relative to the third beam in response to an acceleration along an axis perpendicular to the surface of the substrate.

16. The hand-held device of claim 15, wherein the first material comprises a third semiconductor.

17. The hand-held device of claim 16, wherein the first, second, and third semiconductors are silicon.

18. The hand-held device of claim 15, wherein the movement of the second beam relative to the third beam is used in a capacitance-based displacement transducer.

* * * * *